(12) United States Patent
Mangelinck et al.

(10) Patent No.: US 7,419,905 B2
(45) Date of Patent: Sep. 2, 2008

(54) GATE ELECTRODES AND THE FORMATION THEREOF

(75) Inventors: Dominique Mangelinck, Marseille (FR); Dongzhi Chi, Singapore (SB); Syamal Kumar Lahiri, Milpitas, CA (US)

(73) Assignee: Agency for Science, Technology and Research, Singapore (SG)

( * ) Notice: Subject to any disclaimer, the term of this patent is extended or adjusted under 35 U.S.C. 154(b) by 479 days.

(21) Appl. No.: 10/707,968

(22) Filed: Jan. 29, 2004

(65) Prior Publication Data

US 2006/0128125 A1    Jun. 15, 2006

Related U.S. Application Data

(63) Continuation of application No. PCT/SG02/00174, filed on Jul. 31, 2002, now abandoned.

(30) Foreign Application Priority Data

Jul. 31, 2001    (SG)    ................................. 0104614-3

(51) Int. Cl.
    *H01L 21/44*    (2006.01)
(52) U.S. Cl. ................ 438/664; 257/388; 257/E21.199; 257/E21.622
(58) Field of Classification Search ................. 438/664; 257/388, E21.199, E21.622
    See application file for complete search history.

(56) References Cited

U.S. PATENT DOCUMENTS

| | | | | |
|---|---|---|---|---|
| 4,622,735 A | | 11/1986 | Shibata | 438/143 |
| 4,830,971 A | | 5/1989 | Shibata | 438/143 |
| 5,397,909 A | * | 3/1995 | Moslehi | 257/383 |
| 5,705,417 A | * | 1/1998 | Tseng | 438/305 |
| 5,851,891 A | | 12/1998 | Dawson et al. | 438/305 |
| 5,937,315 A | | 8/1999 | Xiang et al. | 438/486 |
| 5,952,701 A | * | 9/1999 | Bulucea et al. | 257/407 |
| 6,084,279 A | * | 7/2000 | Nguyen et al. | 257/412 |
| 6,100,173 A | * | 8/2000 | Gardner et al. | 438/592 |
| 6,204,103 B1 | * | 3/2001 | Bai et al. | 438/224 |
| 6,265,272 B1 | | 7/2001 | Chen | 438/300 |
| 6,555,438 B1 | * | 4/2003 | Wu | 438/305 |

* cited by examiner

*Primary Examiner*—Asok K Sarkar
(74) *Attorney, Agent, or Firm*—Horizon IP Pte Ltd

(57) ABSTRACT

A method of fabricating a gate electrode for a semiconductor comprising the steps of: providing a substrate; providing on the substrate a layer of a first material of thickness $t_p$, the first material being selected from the group consisting of Si, $Si_{1-x}$—$Ge_x$ alloy, Ge and mixtures thereof and a layer of metal of thickness $t_m$; and annealing the layers, such that substantially all of the first material and the metal are consumed during reaction with one another.

33 Claims, 7 Drawing Sheets

(4) After metal etch-off

CMOS structure

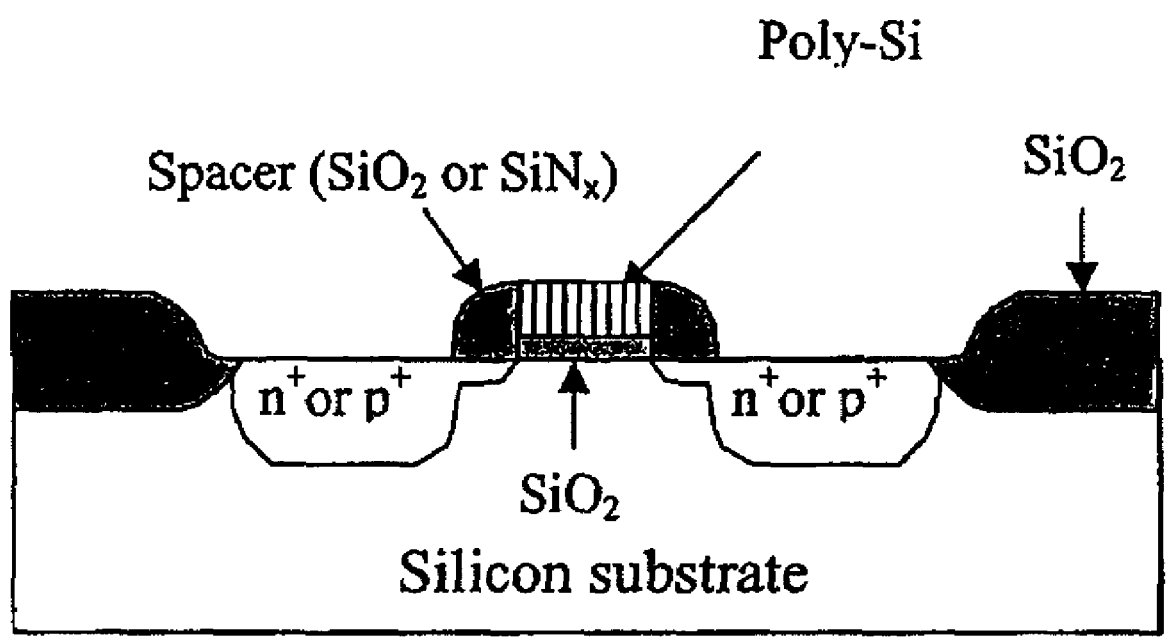
(1) Before metal deposition
Figure 2 (1)

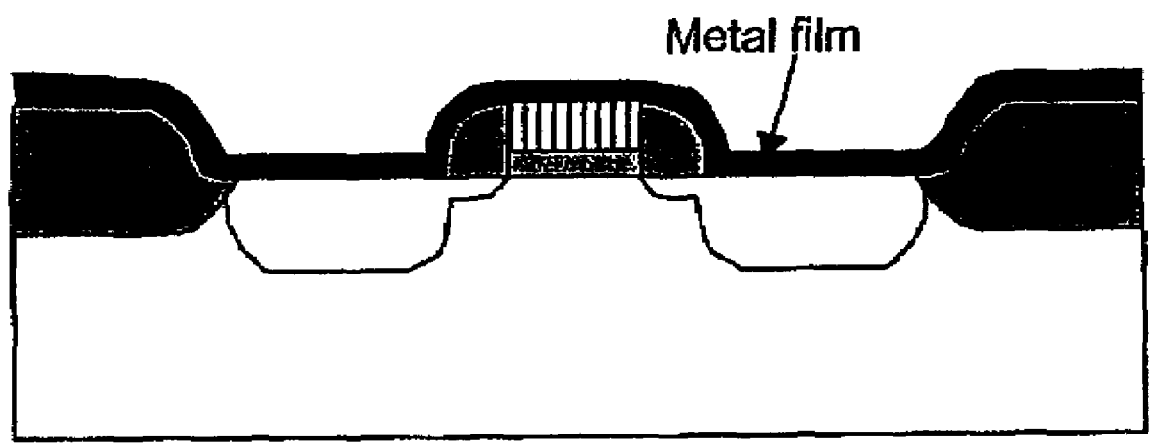
(2) After metal deposition
Figure 2 (2)

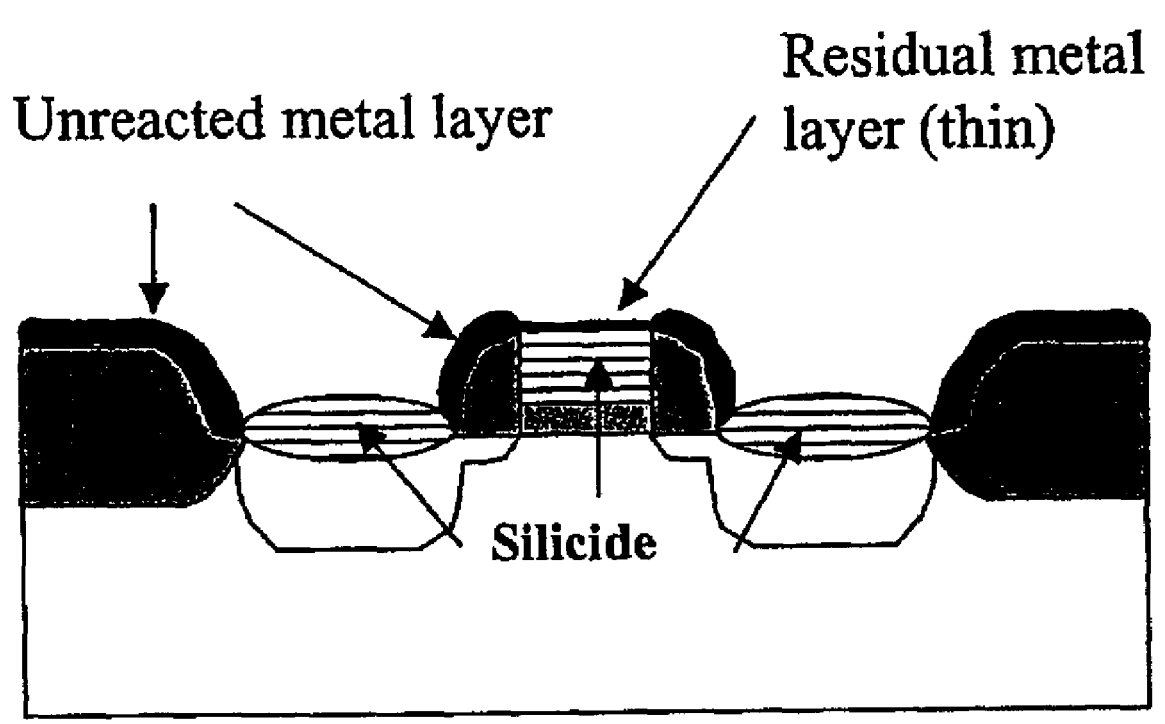
(3) After silicide formation
Figure 2 (3)

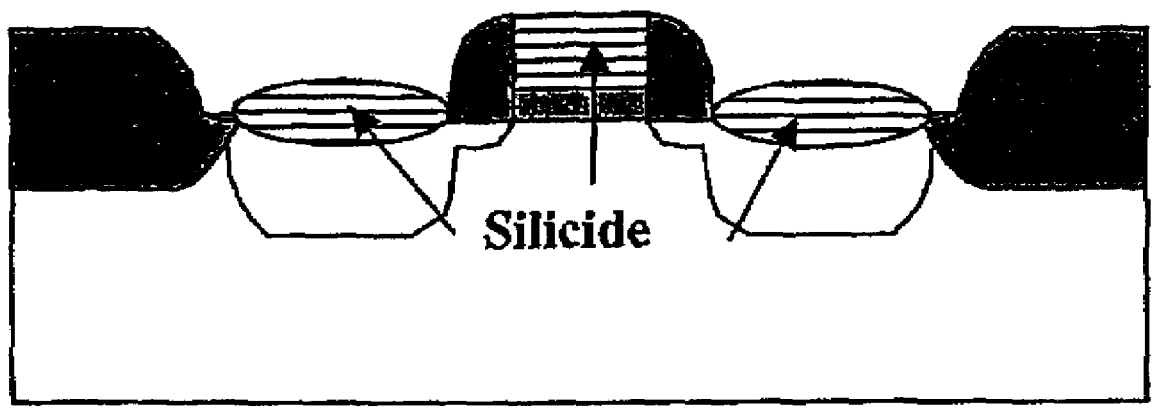
(4) After metal etch-off
Figure 2 (4)

GATE ELECTRODES AND THE FORMATION THEREOF

CROSS REFERENCE TO RELATED APPLICATIONS

This application is a continuation of International Application No. PCT/SG02/00174, filed Jul. 31, 2002, now abandoned. The international application claims priority to Singaporean Application No. 200104614-3, filed Jul. 31, 2001.

BACKGROUND OF INVENTION

Referring to FIG. 1 of the accompanying drawings, a complementary metal oxide semiconductor (CMOS) transistor comprises an n channel MOS (NMOS) and a p channel MOS (PMOS). Historically, a polycrystalline $n^+$-Si gate is used as a gate electrode both in NMOS and PMOS transistors. For PMOS transistors additional boron implantation into the channel region of the Si substrate is needed to control the threshold voltage because of the low work function of $n^+$-Si. This can produce short channel effects and large sub-threshold currents and thus the PMOS transistor is less scaleable than the NMOS transistor. In order to solve this problem, a dual gate configuration where polycrystalline $n^+$-Si and $p^+$-Si are used as the gate for the NMOS and PMOS transistors, respectively, has been suggested. However, the dual gate CMOS has drawbacks, most notably boron penetration (for PMOS) through the gate oxide and the poly-depletion effect. Instead of using a dual gate, a material with a work function close to the value of the middle of the bandgap of silicon (4.61 eV), can be used for both NMOS and PMOS transistors. A material with such a work function is called a mid-gap material and the process utilising this material for a gate electrode is known as mid-gap CMOS technology.

In addition, the contact surface of the gate electrode is actually provided by a silicide layer ($TiSi_2$, $CoSi_2$, $PtSi_2$, PtSi or NiSi) on top of the polycrystalline Si gate (e.g. n+-Si) in current CMOS fabrication processes. At relatively high temperatures (e.g. 600° C.), the silicide film is usually degraded by two phenomena: inversion and agglomeration. Inversion is due to the grain growth of Si during the formation of silicide and occurs when the metal (e.g. Co, Ni) is the diffusing species during the growth of the silicide. This phenomenon results in suicide grains inside Si and at the interface between gate electrode and the silicon oxide layer on the Si wafer as well as large grains of Si at the surface, causing inversion. Agglomeration on the other hand is due to a reduction of the interfacial energy and results in large grains of silicide extended across the polycrystalline Si. These two phenomena limit the use of silicide as a good contact material for the gate electrode. A review of the problems caused by inversion and agglomeration can be found in Colgan EG, Gambino J P, Hong Q Z, MAT SCI ENG R 16 (1996) 43.

Several materials, such as Mo, $MoSi_2$, W, $WSi_2$, and TiN, have been proposed as mid-gap materials. However the use of these materials involves complex processing and has other drawbacks. Polycrystalline alloys of Si and Ge with silicide contacts have also been studied but do not alleviate the inversion and agglomeration problems. For the challenge presented in identifying suitable gate electrode materials, please refer to The International Technology Roadmap For Semiconductors: 1999.

SUMMARY OF INVENTION

It is an object of the present invention to seek to provide a new method of producing a gate electrode compatible with and for use in CMOS applications. More precisely, the present invention seeks to provide a new method of producing a gate electrode which not only has a work function very close to the mid-gap of silicon band gap but also avoids inversion and agglomeration problems encountered in conventional poly-silicon gate processes.

A further object of the present invention is to seek to fabricate a gate electrode and source/drain silicide contacts in a single process step using the same mask: a feat impossible in other mid-gap metal gate processes. Accordingly, the present invention provides a method of fabricating a gate electrode for a semiconductor comprising the steps of: providing a substrate; providing on the substrate a layer of a first material of thickness $t_p$, the first material being selected from the group consisting of Si, $Si_{1-x}$—$Ge_x$ alloy, Ge and mixtures thereof and a layer of metal of thickness $t_m$; and annealing the layers, such that substantially all of the first material and the metal are consumed during reaction with one another.

Preferably, the metal is selected from one of the group consisting of Ni, Pd, Pt, Co, Ti and alloys of these materials including Ni—Pt, Ni—Pd, Ni—Co.

Conveniently, the first material layer is applied to the substrate and the metal layer is provided on the first material layer.

Advantageously, the thicknesses $t_p$ and $t_m$ are related by a predetermined ratio of $t_m/t_p$.

Preferably, the ratio of $t_m/t_p$ is determined by the particular first material and metal to be annealed.

Conveniently, annealing is performed at temperatures ranging from 300 to 900° C.

Advantageously, the method further includes the step of depositing a further layer of metal on the gate electrode to increase gate thickness.

Preferably, the method further comprises the step of forming source/drain contacts simultaneously with the gate electrode.

Conveniently, as much as 5% of the first material and the metal remains following reaction with the metal and the first material.

Another aspect of the present invention provides a gate electrode for a semiconductor device comprising a substrate and a gate layer thereon formed by the annealing of a first material with a metal, substantially all of the first material and the metal having been consumed during reaction with one another, the resultant layer comprising the gate electrode.

Preferably, the first material is selected from the group consisting of Si, $Si_{1-x}Ge_x$ alloy, Ge and mixtures thereof.

BRIEF DESCRIPTION OF DRAWINGS

FIGS. 2 (1) to (4) are schematic cross-sections of devices embodying the present invention at different processing stages;

Figure 1:
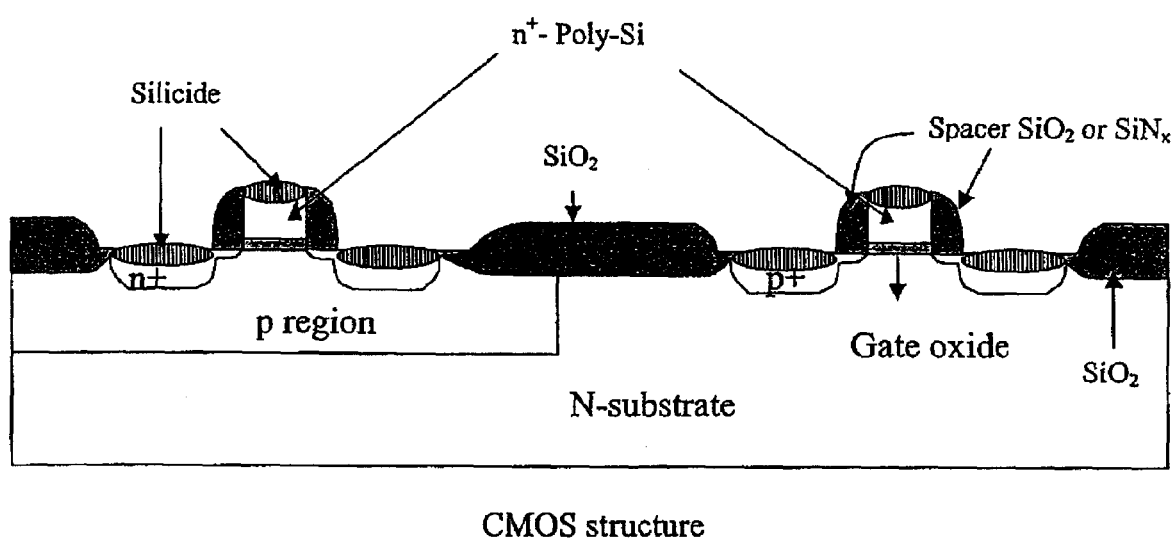
FIG. 1 is a schematic cross section through a conventional CMOS transistor.

illustrating the inversion phenomenon, the peaks on the left hand side comprising Si peaks and the peaks on the right hand side comprising Ni peaks.

DETAILED DESCRIPTION

According to an embodiment of the present invention, a polycrystalline/amorphous film of Si, $Si_{1-x}$—Ge alloy, Ge or mixtures thereof is first deposited on a semiconductor substrate having a silicon oxide ($SiO_2$) gate layer thereon. The polycrystalline/amorphous film is deposited by means of chemical vapor deposition (CVD), plasma enhanced CVD (PECVD), or physical vapor deposition (PVD). The thickness $t_p$ of the polycrystalline/amorphous film applied ranges from 10 to 110 nm depending on the silicide to be formed. Subsequent processing steps include pattern delineation, spacer formation and ion implantation. Then a metal film (Ni, Pd, Pt, Co, or alloys of these materials such as Ni—Pt, Ni—Pd, Ni—Co) is deposited on the silicon wafer which consists of gate oxide regions (already covered by polycrystalline/amorphous films), bared silicon regions (e.g., source/drain regions), and insulating regions ($SiO_2$, $SiN_x$). The thickness $t_m$ of the metal film is usually around 10 to 150 nm. The relative thicknesses of the metal film and the polycrystalline/amorphous film are determined by a ratio $t_m/t_p$ as explained below with reference to table 1.

The ratio of $t_m/t_p$ should be such that substantially all the polycrystalline/amorphous gate film and the metal film are consumed during the formation of specific suicides (NiSi, $Pd_2Si$, PtSi, $CoSi_2$ or their alloys) or compounds ($Ni(Si_{1-x}Ge_x)$, $P2(Si_{1-x}Ge_x)$, $Pt(Si_{1-x}Ge_x)$, $Co(Si_{1-x}Ge_x)_2$ or their alloys) in subsequent chemical reaction between the metal film and the polycrystalline/amorphous film with no or only a small amount of either of the films remaining. Such a perfect match of the two constituents is very difficult to achieve but the benefits of the invention are still conferred if small amounts of either the metal film or the polycrystalline/amorphous film remain unreacted or not consumed.

Any remaining metal film (a small percentage of original film (between 0 to 10%)) on top of the specific silicide or compound already formed in the gate regions is then etched off using an appropriate solvent.

There may be in the region of 0 to 10% (preferably only up to 5%) unreacted metal film remaining which needs to be etched off. Similarly, as much as 5% of the polycrystalline/amorphous gate film may not be consumed whilst still conferring the advantages of the present invention.

Table 1 below specifies the minimum ratio of thicknesses ($t_m/t_p$) of the metal and polycrystalline silicon layers necessary to achieve substantially complete consumption of polycrystalline film during the chemical reaction for different metals. Further information such as melting temperature, resistivity, and work function for the resultant silicide is also given.

TABLE 1

| Resultant Silicide | Ratio ($t_m/t_p$) | Melting temp. (° C.) | Resistivity (mW · cm) | Work function (eV) |
|---|---|---|---|---|
| NiSi | 0.54 | 1000 | 14-20 | 4.55 |
| $Pd_2Si$ | 1.47 | 1667 | 25-35 | 4.61 |
| PtSi | 0.75 | 1229 | 28-35 | 4.63 |
| $CoSi_2$ | 0.27 | 1326 | 16-18 | 4.52 |
| $TiSi_2$ | 0.44 | 1540 | 13-16 | 4.38 |

The deposition of the metal film uses conventional techniques, including sputtering, CVD, electron-beam evaporation, or filament evaporation techniques. Specific silicide or compound metal gate formation is then carried out using either conventional furnace or rapid thermal process (RTP) annealing in an inert atmosphere within a suitable temperature range of 300-900° C. so that the whole polycrystalline gate film is consumed during the formation of specific suicides (NiSi, $Pd_2Si$, PtSi, $COSi_2$ or their alloys) or compounds ($Ni(Si_{1-x}Ge_x)$, $P2(Si_{1-x}Ge_x)$, $Pt(Si_{1-x}Ge_x)$, $Co(Si_{1-x}Ge_x)_2$ or their alloys) with no remaining metal film or only small amount of remaining metal film (few percentage of original film) on top of the specific silicide or compound already formed in the gate regions. Unreacted metal films are then etched off using appropriate solvent in a conventional manner. Thus, it will be appreciated that embodiments of the invention provide a novel method of fabricating a metal silicide gate electrode.

Some of the benefits provided by embodiments of the invention are as follows: (i) only silicide or compound film with the predetermined metal/polycrystalline (or amorphous) thickness ratio ($t_m/t_p$) forms in the gate after the silicidation process, thus eliminating both the driving force for inversion which is the reduction of the grain boundary energy of Si, $Si_{1-x}Ge_x$, or Ge and the driving force for the formation of silicon-rich silicide (in the case of NiSi, Ni(Pt)Si, and $Pd_2Si$); (ii) all the metal suicides or compounds embodied in the present invention have good thermal stability when they are in contact with $SiO_2$ and thus alleviate thermal stability concerns; and (iii) the same kinds of suicides or compounds which are used for source/drain region contacts can be used as mid-gap metal gate, which means both the formation of a metal gate and a source/drain contact can be done at the same time (eliminating extra process steps which are necessary if other metals (e.g., W) are used as gate materials.

EXAMPLE

As in the fabrication of a CMOS field effect transistor, the normal process steps are carried out but with a specific additional condition that all the polycrystalline Si film is consumed during the formation of a specific silicide (for example, NiSi, Pd2Si, PtSi, or COSi2) to form a silicide gate electrode. FIG. 2 (1) to (4) illustrate schematic cross sections of the devices at differing processing stages. Polycrystalline films of Si and Si—Ge alloy were deposited by chemical vapour deposition on silicon substrate which comprises gate regions, source/drain regions and insulating regions. A metal film of Ni with a thickness of about 30 nm was then deposited by sputtering. The thickness of polycrystalline Si was about 50 nm. The ratio of metal/polycrystalline film is 3/5, which is larger than the minimum required to completely consume polycrystalline silicon film after NiSi formation, thus ensuring a complete transformation of the poly-Si into NiSi. For comparison purposes (to show the inversion effect in this case), a polycrystalline film with a thickness of about 150 nm was also deposited on silicon substrate followed by the deposition of 30 nm thick Ni deposition. The thickness ratio of metal/polycrystaline film in this case is 1/5, which is smaller than the critical value required for complete consumption of polycrystalline films thus resulting in only partial consumption of polycrystalline film. Annealing of one-minute duration was performed by rapid thermal processing (RTP) in an $N_2$ atmosphere at temperatures ranging from 300 to 900° C. X-ray diffraction (XRD), scanning electron microscopy and Rutherford back scattering (RBS) techniques were used to monitor the formation, microstructure and orientation of the silicide. The sheet resistance of the films was measured by the four point probe technique and used to deduce the resistivity of the films.

Figure 3:
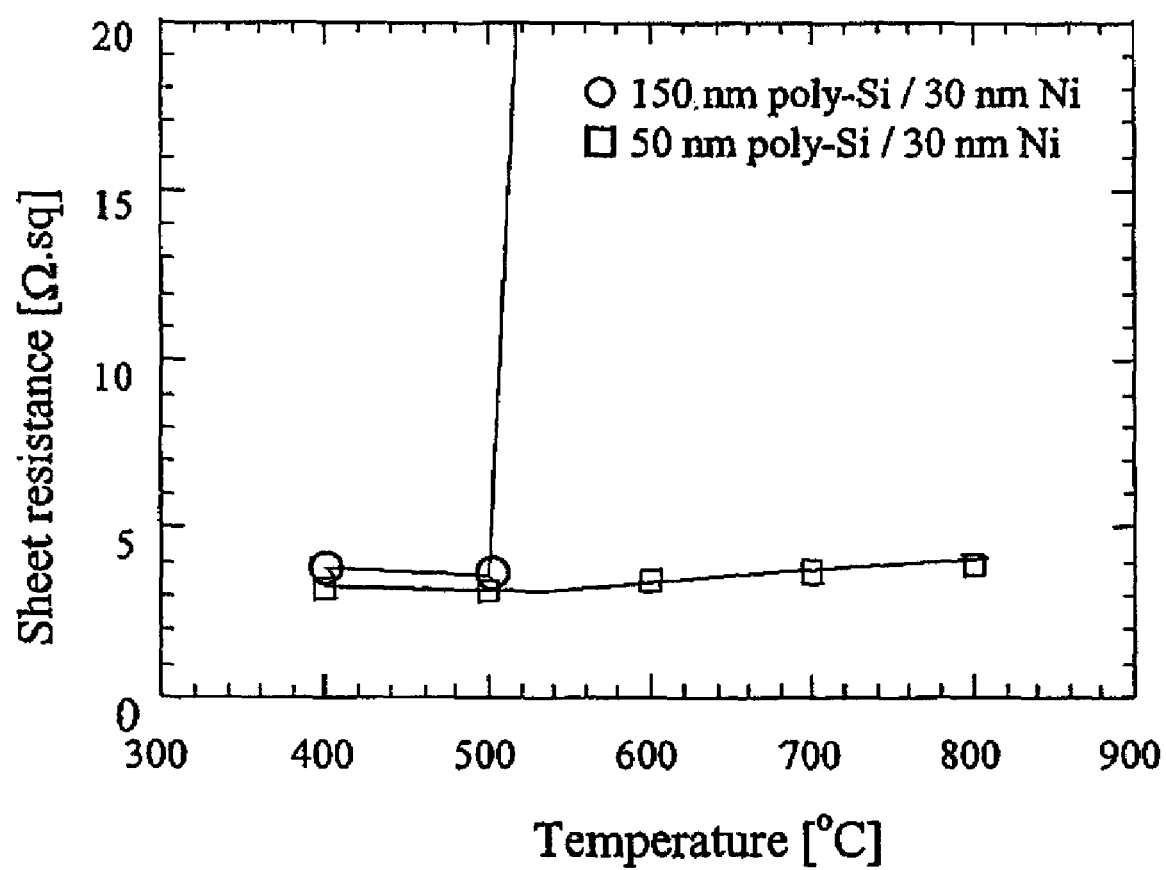
FIG. 3 is a graph of sheet resistance as a function of the annealing temperature for two nickel/poly-Si double layer structures on silicon oxide: one with 40 nm Ni on top of 70 nm poly-Si and another with 40 nm Ni on top of a thickness of 150 nm poly-Si.
Figure 4:
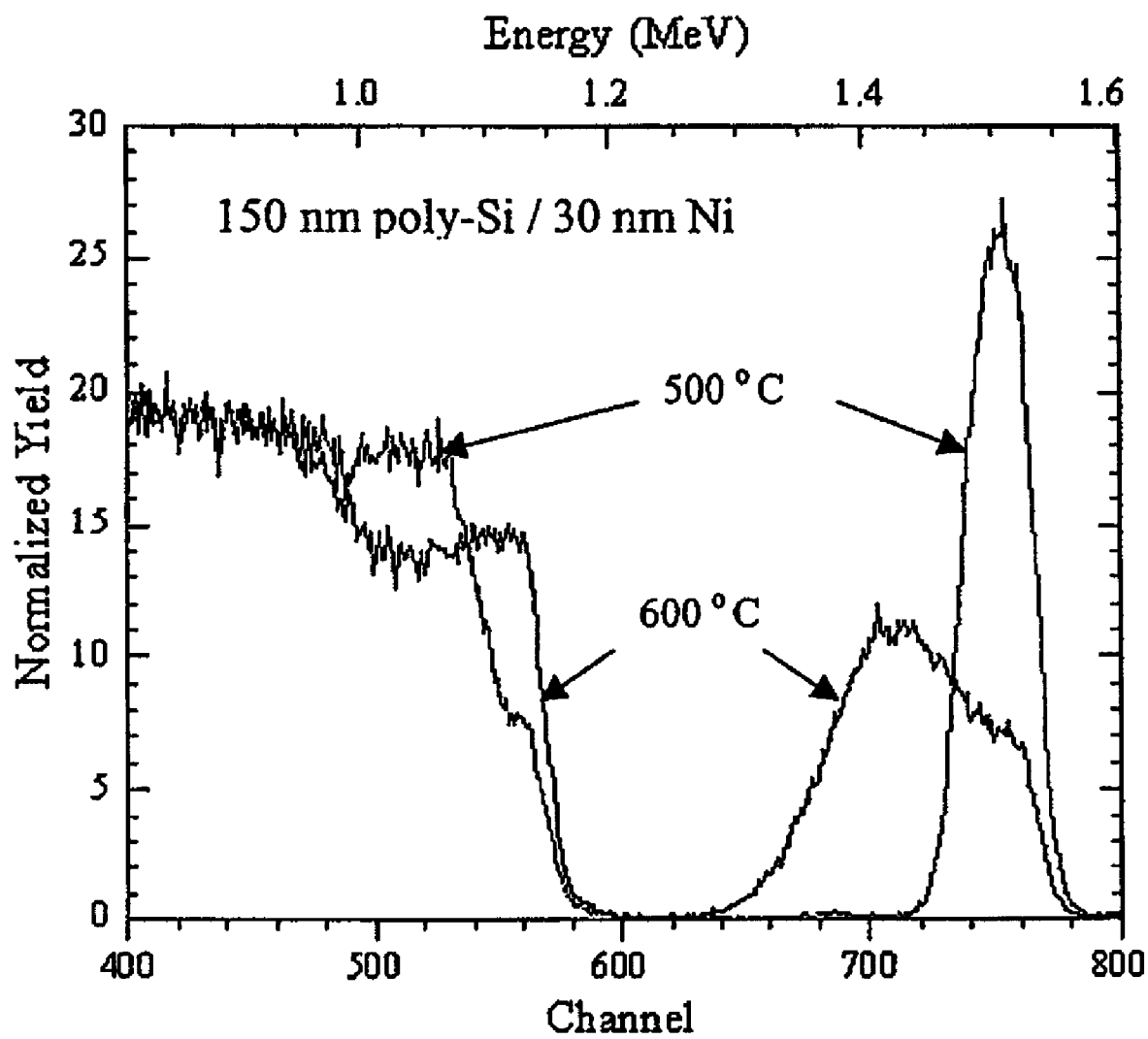
FIG. 4 is an RBS spectragraph of a nickel/poly-Si double layer structure on silicon dioxide with 40 nm Ni on top of 150 nm poly-Si on silicon oxide annealed at 500° C. and 600° C.

Turning now to FIG. 3, this shows sheet resistance values as a function of the annealing temperature for two polycrystalline films: one with a thickness of 50 nm and another with a thickness of 150 nm. When the thickness of the polycrystalline film is large, a large increase in the sheet resistance is observed at temperatures above 500° C. RBS spectra (see FIG. 4) show that at 500° C. the NiSi film is homogenous while NiSi is found deeper in the polycrystalline Si layer at 600° C. indicating that inversion has taken place. This was confirmed by XRD and SEM. The increase in sheet resistance is thus mainly due to inversion. For the sample with a $t_m/t_p$ ratio of 3/5 (enabling complete consumption of NiSi), the sheet resistance is still low at 800° C.

Most of the suicides listed in Table 1 are stable when they are in contact with $SiO_2$ (except $TiSi_2$) and thus methods embodying the present invention increase the thermal stability of the silicide gate. The use of Ti as the metal layer is envisaged but as the resultant silicide, $TiSi_2$, can react with $SiO_2$, its use may not be preferred due to detrimental effects on the stability of the gate oxide, except in special applications.

The maximum temperature at which the silicide is stable is close to the melting temperature of the silicide. Table 1 gives the melting temperatures of some silicides, which have been selected for their low resistivity, as well as their work function. The work function of NiSi, $Pd_2Si$ and PtSi are advantageously very close to the mid-gap of Si (4.61 eV) and thus may be the materials of choice for the mid-gap CMOS process. As the resistivity of these suicides is also low they can be used also for contact on the source and drain through the self-aligned silicidation process.

Following current trends, junctions are becoming progressively more shallow. In order to preserve the integrity of junctions, silicide films are becoming thinner. Thus, the metal film to be deposited on the source and drain cannot be too thick. In a self-aligned silicide process, the metal is deposited simultaneously on the source, the drain and the polycrystalline Si gate and thus the total thickness of the silicide gate oxide will be thin also. This should not interfere with the electronic characteristics of devices created in this manner. However if device design requires a greater gate thickness, then additional process steps should be used to deposit extra metal on polycrystalline silicon gates having greater gate thicknesses.

It should be noted that references in the description to polycrystalline Si should be considered as referring to polycrystalline Si and amorphous material. More particularly, the polycrystalline/amorphous material is selected from the group consisting of: Si, $Si_{1-x}Ge_x$, Ge and mixtures thereof.

In the present specification "comprises" means "includes or consists of" and "comprising" means "including or consisting of".

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

The invention claimed is:

1. A method of fabricating a gate electrode for a semiconductor comprising the steps of:
   providing a substrate prepared with a gate stack, the gate stack includes a gate dielectric on the substrate and a gate layer on the gate dielectric, the gate layer comprising a first material of thickness $t_p$, the first material being selected from the group consisting of Si, $Si_{1-x}$—$Ge_x$ alloy, Ge and mixtures thereof;
   providing a metal layer on the gate layer, the metal layer having a thickness $t_m$, wherein the thicknesses $t_p$ and $t_m$ are related by a predetermined ratio of $t_m/t_p$; and
   annealing the layers, wherein the predetermined ratio results in all of the first material of the gate layer and substantially all of the metal of the metal layer over the gate layer being consumed during reaction with one another to form a resulting layer which serves as a gate electrode in contact with the gate dielectric, wherein the gate electrode comprises a work function close to about a mid-gap of silicon band gap.

2. The method of claim 1, wherein the metal layer comprises a metal selected from one of the group consisting of Ni, Pd, Pt, Co, and alloys of these materials including Ni—Pt, Ni—Pd, Ni—Co.

3. The method of claim 1, wherein the gate stack further comprises dielectric sidewall spacers and providing the metal layer comprises depositing the metal layer on the first material layer.

4. The method of claim 1, wherein the ratio of $t_m/t_p$ is determined by the particular first material and metal to be annealed.

5. The method of claim 1 wherein annealing is performed at temperatures ranging from 300 to 900° C.

6. The method of claim 1 further comprising the step of depositing a further layer of metal on the gate electrode to increase gate thickness.

7. The method of claim 6 comprising forming source/drain contacts simultaneously with the gate electrode.

8. The method of claim 6, wherein as much as 5% of the metal remains following reaction with the other of the metal and the first material.

9. A gate electrode for a semiconductor device comprising:
   a substrate with a gate stack formed thereon, the gate stack includes a gate dielectric on the substrate and the gate electrode on the gate dielectric,
   wherein the gate electrode comprises a work function close to about a mid-gap of silicon band gap in which all of a first gate material and substantially all of a metal have been consumed during reaction with one another caused by annealing.

10. The gate electrode of claim 9, wherein the metal is selected from one of the group consisting of Ni, Pd, Pt, Co, and alloys of these materials including Ni—Pt, Ni—Pd, Ni—Co.

11. The gate electrode of claim 9, wherein the first gate material is selected from the group consisting of Si, $Si_{1-x}Ge_x$ alloy, Ge and mixtures thereof.

12. The gate electrode of claim 9 wherein as much as 5% of the metal remains following reaction with the other of the metal and the first material.

13. The gate electrode of claim 12, wherein a layer of metal is provided on the first material.

14. The gate electrode of claim 9 wherein the gate electrode is incorporated in a CMOS semiconductor device.

15. A method for forming an integrated circuit comprising:
   providing a substrate prepared with a first gate stack with dielectric sidewall spacers on the substrate and first and second diffusion regions in the substrate adjacent to the gate stack, the gate stack includes a gate dielectric on the substrate and a gate layer on the gate dielectric,
   the gate layer comprises an amorphous or polycrystalline material having a thickness $t_p$;

depositing a metal layer over the substrate covering the gate stack and diffusion regions, the metal layer having a thickness $t_m$, wherein the thicknesses $t_p$ and $t_m$ are related by a predetermined ratio of $t_m/t_p$; and processing the metal layer to cause a reaction between the gate layer and the metal layer, wherein the predetermined ratio results in all the material of the gate layer and portions of the metal layer over the gate layer being consumed to form a resulting layer having a work function close to a mid gap of silicon band gap which serves as the gate electrode which contacts the gate dielectric, wherein problems associated with inversion and agglomeration associated with formation of the transistor are reduced.

16. The method of claim 15 wherein:

the substrate is prepared with at least first and second gate stacks with dielectric sidewall spacers on the substrate and first and second diffusion regions in the substrate adjacent to the gate stacks, the gate stacks include a gate dielectric on the substrate and a gate layer on the gate dielectric, the first and second gate stacks serving as a first PMOS transistor and a first NMOS transistor to form a CMOS integrated circuit; and the material of the gate layer comprises silicon, germanium, alloys or a combination thereof, including $Si_{1-x}Ge_x$.

17. The method of claim 16 wherein a metal material of the metal layer is selected from one of the group consisting of Ni, Pd, Pt, Co, and alloys of these materials including Ni—Pt, Ni—Pd, Ni—Co.

18. The method of claim 15 wherein the material of the gate layer comprises silicon, germanium, alloys or a combination thereof, including $Si_{1-x}Ge_x$.

19. The method of claim 15 wherein processing the metal layer comprises annealing or rapid thermal annealing.

20. The method of claim 19 wherein unreacted metal layer is less than or equal to 10%.

21. The method of claim 15 wherein processing the metal layer also forms silicide over the diffusion regions.

22. The method of claim 21 wherein processing the metal layer comprises annealing or rapid thermal annealing.

23. The method of claim 22 wherein unreacted metal layer is less than or equal to 10%.

24. The method of claim 15 wherein a metal material of the metal layer comprises Ni, Pd, Pt, Co, or a combination of alloys thereof including Ni—Pt, Ni—Pd, and Ni—Co.

25. The method of claim 24 wherein processing the metal layer also forms silicide over the diffusion regions.

26. The method of claim 25 wherein processing the metal layer comprises annealing or rapid thermal annealing.

27. The method of claim 24 wherein processing the metal layer comprises annealing or rapid thermal annealing.

28. The method of claim 15 further comprises etching remaining portion of unreacted metal layer above the gate electrode after processing the metal layer.

29. The method of claim 28 wherein processing the metal layer comprises annealing.

30. The method of claim 28 wherein processing the metal layer also forms silicide over the diffusion regions.

31. The method of claim 30 wherein processing the metal layer comprises annealing or rapid thermal annealing.

32. An integrated circuit comprising:

a transistor disposed on a substrate, the transistor having
a gate stack with a gate dielectric disposed on the substrate and a gate electrode disposed on and in contact with the gate dielectric, and
first and second diffusion regions adjacent to the gate stack, the gate electrode is formed from an amorphous or polycrystalline first layer and a metal layer in which all of the first layer and substantially all of the metal layer have been consumed during reaction with one another caused by annealing, wherein problems associated with inversion and agglomeration associated with formation of the transistor are reduced.

33. A method of fabricating a gate electrode for a semiconductor comprising the steps of:

providing a substrate prepared with a gate stack, the gate stack includes a gate dielectric on the substrate and a gate layer on the gate dielectric, the gate layer comprising a first material of thickness $t_p$, the first material being selected from the group consisting of Si, $Si_{1-x}$—$Ge_x$ alloy, Ge and mixtures thereof;

providing a metal layer on the gate layer, the metal layer having a thickness $t_m$; and annealing the layers, wherein all of the first material of the gate layer and at least substantially all of the metal of the metal layer over the gate layer are consumed during reaction with one another to form a resulting layer which serves as the gate electrode in contact with the gate dielectric, the gate electrode comprising a work function close to about a mid-gap of the silicon band gap, and wherein source/drain contacts are formed simultaneously with the gate electrode.

* * * * *